United States Patent [19]

Wollam

[11] Patent Number: 5,118,400
[45] Date of Patent: Jun. 2, 1992

[54] METHOD OF MAKING BIOCOMPATIBLE ELECTRODES

[75] Inventor: John S. Wollam, Acton, Mass.

[73] Assignee: Spire Corporation, Bedford, Mass.

[21] Appl. No.: 471,410

[22] Filed: Jan. 29, 1990

[51] Int. Cl.$^5$ ............................................. C23C 14/34
[52] U.S. Cl. ........................... 204/192.15; 204/192.11; 204/192.3
[58] Field of Search ....................... 204/192.11, 192.15, 204/192.17, 192.3, 192.32, 192.34; 128/784, 419 P; 427/122, 123

[56] References Cited

U.S. PATENT DOCUMENTS

| 4,342,632 | 8/1982 | Heim et al. ................. 204/192.15 X |
| 4,440,108 | 4/1984 | Little et al. ........................ 118/723 |
| 4,440,178 | 4/1984 | Bussard et al. ..................... 128/784 |
| 4,443,488 | 4/1984 | Little et al. ........................... 427/38 |
| 4,526,673 | 4/1985 | Little et al. ........................ 204/192 |
| 4,542,752 | 9/1985 | DeHaan et al. .................... 128/784 |
| 4,612,100 | 9/1986 | Edeling et al. ................. 128/784 X |
| 4,693,760 | 9/1987 | Sioshansi ................................. 148/4 |
| 4,720,401 | 1/1988 | Ho et al. ..................... 204/192.15 X |
| 4,743,308 | 5/1988 | Sioshansi et al. ........................ 148/4 |
| 4,855,026 | 8/1989 | Sioshansi ........................ 204/192.11 |
| 4,934,381 | 6/1990 | MacGregor ......................... 128/784 |

OTHER PUBLICATIONS

O. W. Holland et al., "Hillock Reduction in Ion-Implanted Metal", J. Electroch. Soc: *Solid-State Science and Technology*, Aug. 1987; pp. 2017-2019.

A. J. Weigand et al., "Ion-Beam-Sputter Modification of the Surface Morphology of Biological Implants", *Journal Vac. Sci. Technol.*, vol. 14, Jan./Feb. 1977 pp. 326-330.

A. J. Weigand, "Mechanical Properties of Ion-Beam-Textured Surgical Implant Alloys", *J. Vac. Sci. Technol.* 15 (2) Mar./Apr. 1978 pp. 718-224.

Harold R. Kaufman et al., "Ion Beam Texturing of Surfaces", *J. Vac. Sci. Technol.*, 16 (2) Mar./Apr. 1979 pp. 175-178.

Bruce A. Banks, "Ion Bombardment Modification of Surfaces in Biomedical Applications", *Ion Bombardment Modification* ... Elsevier 1984 Chapter 10.

Lewis Research Center, "Process Produces Low-Secondary-Electron-Emission Surfaces" *NASA Tech Briefs*, Mar./Apr. 1986 pp. 88 & 90.

A. J. Weigand, "The Use of an Ion-Beam Source to Alter the Surface ... " *NASA Technical Memorandum 78851* 1978 pp. 1-17.

A. J. Weigand et al., "Mechanical and Chemical Effects of Ion-Texturing Biomedical Polymers" *NASA Technical Memorandum 79245*, 1979 pp. 1-13.

*Primary Examiner*—Nam Nguyen
*Attorney, Agent, or Firm*—Morse, Altman, Dacey & Benson

[57] ABSTRACT

A process of improving the sensing function of biocompatible electrodes and the product so made are disclosed. The process is designed to alter the surfaces of the electrodes at their tips to provide increased surface area and therefore decreased contact resistance at the electrode-tissue interface for increased sensitivity and essentially includes rendering the tips atomically clean by exposing them to bombardment by ions of an inert gas, depositing an adhesion layer on the cleaned tips, forming a hillocked layer on the adhesion layer by increasing the temperature of the tips, and applying a biocompatible coating on the hillocked layer. The resultant biocompatible electrode is characterized by improved sensitivity, minimum voltage requirement for organ stimulation and a longer battery life for the device in which it is employed.

9 Claims, 4 Drawing Sheets

METHOD OF MAKING BIOCOMPATIBLE ELECTRODES

This invention has been, in part, conceived and reduced to practice in the performance of work funded in part by a contract amended by the U.S. Department of Energy.

BACKGROUND OF THE INVENTION

1. Field of the Invention

The present invention relates generally to biocompatible electrodes and, more particularly, to a process of improving the sensing function of biocompatible electrode tips and products so made.

2. The Prior Art

Biocompatible electrodes are required in implants, such as for example, cardiac pacemakers. Among other considerations, implants need be as small as possible. Their electrode tips, however, must exhibit large surface areas. Such large surface areas at the tips of biocompatible electrodes are desirable, inter alia, so that the tips provide minimum contact resistance at any electrode-tissue interface. Consequently, electrode tips with large surface areas enhance the sensitivity of the pacemaker, are instrumental in keeping the voltage required for stimulation of the heart muscle low, and increase battery lifetime. The above in turn helps to reduce patient stress in allowing longer intervals between battery replacements.

In the beginning, biocompatible electrodes featured domeshaped tips with smooth exterior finishes. In the mid 1970's, workers in the field began experimenting with surface roughening techniques for biological implants, including the use of ion-beam sputtering. See A. J. Weigand et al., "Ion-beam-sputter modification of the surface morphology of biological implants," *J. Vac. Sci. Technol.*, 14(1), Jan/ Feb. 1977, 326–331; H. R. Kaufman et al., "Ion beam texturing of surfaces," *J. Vac. Sci. Technol.*, 16(2), Mar./Apr. 1979; A. J. Weigand, "Mechanical properties on ion-beam-textured surgical implant alloys," *J. Vac. Sci. Technol.*, 15(2) Mar/Apr. 1978; Bruce A. Banks, "Ion Bombardment Modification of Surfaces in Biomedical Applications," Chapter 10, Ion *Bombardment Modification of Surfaces*, edited by O. Auciello and R. Kelly, published by Elsevier (1984); A. N. Curren et al of Lewis Research Center, "Process Produces Low-Secondary-Electron- Emission Surfaces, "NASA Tech Briefs, March/April 1986, pp. 89–90; A. J, Weigand, "The use of an ion-beam source to alter the surface morphology of biological implant materials," *NASA TM*-78851, Society for Biomaterials Conference, April/May 1978; and A. J. Weigand et al, "Mechanical and Chemical Effects of Ion-texturing Biomedical Polymers," *NASA TM*-79245, Thirty -second Annual Conference of Engineering in Medicine and Biology, October 1979. The thrust and emphasis of these early efforts have been directed, for the most part, at affecting the mechanical properties of surgical implant alloys, such as their ultimate strength and yield strength regarding hard tissue implants, such as dental implants, and connective tissue in-growth to assure mechanical attachment of and to the implant regarding soft tissue implants, such as vascular prostheses. As far as known, however, the electrical properties of biological implants in general, and of biocompatible electrodes in particular, have not as yet been addressed by or focused on by any worker in the field. There is thus room for improvements.

SUMMARY OF INVENTION

It is a principal object of the present invention to overcome the above disadvantages by providing a process for improving the electrical properties of biocompatible electrodes and biocompatible electrodes made according to that process.

More specifically, it is an object of the present invention to provide a process of improving the sensing function of biocompatible electrodes and of reducing the voltage requirements for organ stimulation and of providing a longer battery life for any device in which such electrodes are employed. The process essentially includes providing a plurality of biocompatible electrodes formed with tips comprised either of assemblies of fine metal wires or of agglomerations of fine metal particles or globules. These biocompatible tips preferably first are cleaned of contaminants such as greases, oil and surface films and the cleaned tips are loaded into a fixture and introduced thereby into a sputtering chamber. The sputtering chamber preferably is evacuated to a negative pressure of at least about $10^{-7}$ torr, an inert gas is introduced into the chamber and a plasma discharge is initiated wherein the electrode tips are negatively charged so that they are bombarded by positive ions of the inert gas to make them atomically clean. The plasma discharge is generated in the chamber by applying rf or dc power to a sputtering electrode so as to sputter deposit an adhesion layer on the electrode tips. Next, rf or dc power at a higher predetermined level is applied to another sputtering electrode so as to deposit and grow a hillocked layer on the adhesion layer. This is followed by applying rf power to cause another sputtering electrode to deposit a biocompatible coating on the hillocked layer. Preferably, during the deposition of the biocompatible coating, the pressure of the inert gas within the chamber is raised, enhancing the throwing power of the coating on the hillocked layer.

Other objects of the present invention will in part be obvious and will in part appear hereinafter.

The invention accordingly comprises the process and the resultant product of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

In general, the present invention pertains to a process of improving the electrical properties in general and of the sensing function in particular of biocompatible electrodes and biocompatible electrodes so made.

The process of the invention essentially is designed to alter the surfaces of biocompatible electrodes at their tips. As is known, biocompatible electrodes are used in surgical implants, such as cardiac pacemakers. By altering the surfaces to increase the surface area of such biocompatible electrodes at their tips, the contact resistance of such tips at their electrode-tissue interfaces is reduced, enhancing their signal transmission capabilities and, consequently, the sensitivity of the device of which they form a part. The altered surfaces also lower the voltage required for stimulation of the heart muscles of any cardiac pacemaker of which they form a part, increasing thereby battery lifetimes. This in turn reduces patient stress and discomfort in permitting longer intervals in between surgical replacements of the batteries of such devices.

Figure 1:
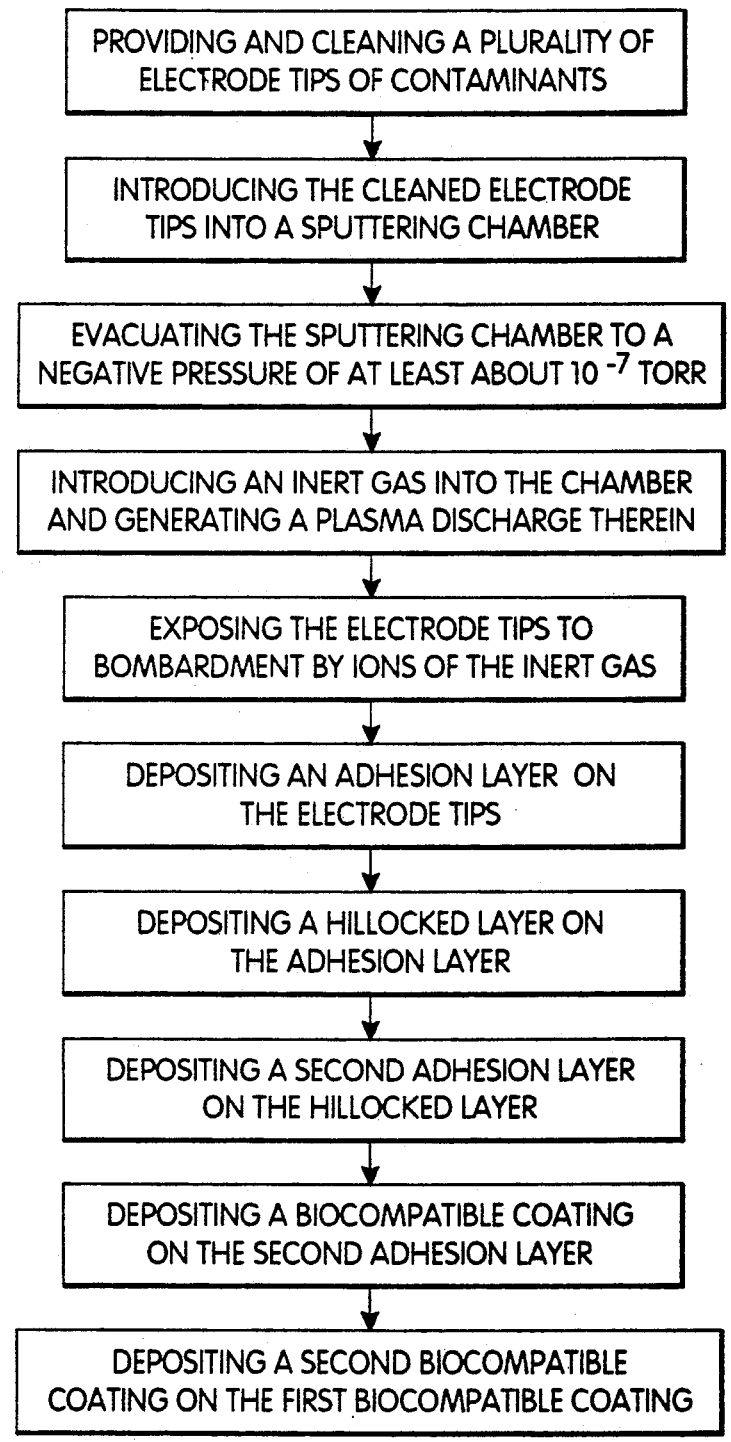
FIG. 1 is a flow diagram illustrating graphically the steps of a preferred process according to the invention.
Figure 5:
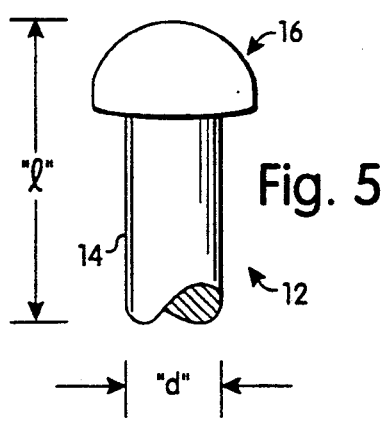
FIG. 5 is a vertical schematic, on an enlarged scale, of one biocompatible electrode prior to its being subjected to the process of the invention.
Figures 6, 7:
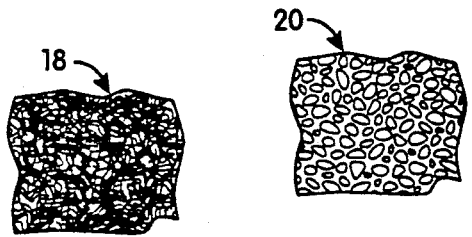
FIG. 6 is a schematic plan view, on an enlarged scale, of a portion of the biocompatible electrode shown in FIG. 5.
FIG. 7 is a view similar to FIG. 6 but showing a portion of a different biocompatible electrode from that illustrated in FIGS. 5 and 6.
Figures 4, 8, 9:
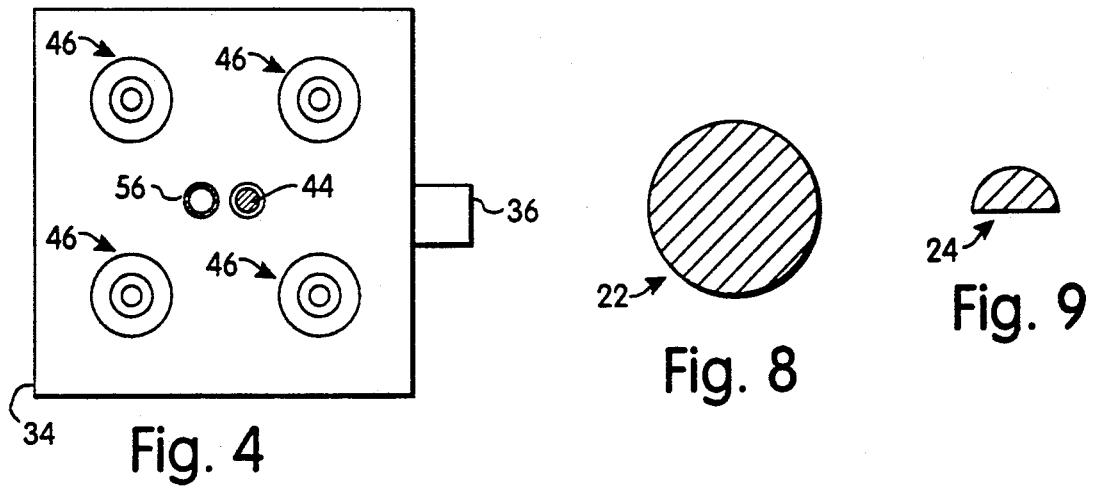
FIG. 4 is a plan view, on a reduced scale, of the apparatus illustrated in FIG. 3.
FIG. 8 is a cross section of a fine wire, on an enlarged scale, of a fine wire mesh useful as a tip for a biocompatible electrode before it is subjected to the process of the invention.
FIG. 9 is a cross section of a fine semi-spherical metal particle, on an enlarged scale, of an agglomeration of fine particles useful as a tip for a biocompatible electrode before it is subjected to the process of the invention.

The process of the invention, designed for improving the electrical properties, in particular the sensing function of biocompatible electrodes is illustrated graphically in a flow diagram 10 in FIG. 1. A vertical schematic of one biocompatible electrode 12, prior to its being subjected to the process of the invention, is illustrated in FIG. 5. Typically, the biocompatible electrode 12 comprises a stem 14 with a preferred diameter "d" of about 0.05" and a length of "l" of about 0.20", and an electrode tip 16. Preferably, the electrode tip 16 comprises an assembly 18 of fine metal wire meshes or bundles of fine wires or both, as illustrated in FIG. 6. In the alternative, the electrode tip 16 of biocompatible electrodes also can be formed of partially sintered agglomerations 20 of metal particles, as illustrated in FIG. 7. A cross sectional view, on an enlarged scale, of a single fine wire 22 of a wire mesh is illustrated in FIG. 8, and that of a single metal particle 24 of the agglomerations 20 is illustrated in FIG. 9.

Preferably as a first step in one preferred process according to the invention, a plurality of biocompatible electrodes 12 are loaded into a sieve 26 and placed thereby successively into one of a plurality of clean vessels 28, such as a Pyrex chemical beaker. By subjecting the electrodes 12 to several successive baths and solvent rinsings, some effected with ultrasonic agitation, as indicated by arrow 30, the electrodes 12 are effectively cleaned of any contaminating greases, oils and/or other surface films. The first vessel 28 preferably contains Electronic Grade trichloroethane, a second vessel (not shown) preferably acetone, and a third vessel (not shown) preferably 2-propanol. The plurality of rinsed electrodes 12 are then allowed to drain dry without loss by evaporation of the solvents. Consequently, dissolved contaminants are carried away by the draining solvent, rather than being allowed to be redeposited on the surfaces of the electrodes 12 as the solvents evaporate.

The cleaned electrodes 12 are next transferred into a clean fixture 32 such that their tips 16 are oriented upwards, as shown. Such orientation for the electrode tips 16 is desired for their proper treatment according to the process of the invention. With the electrodes 12 properly ensconced in the fixture 32, the fixture 32 and thereby the electrodes 12 are introduced into a sputtering chamber 34 via a suitable lock and loading means 36 and are positioned on a sputter etch electrode 38. The sputter etch electrode 38 both physically supports and establishes electrical connection to the electrodes 12 secured in the fixture 32. In addition, the fixture 32 is designed to provide as much thermal insulation to the biocompatible electrodes 12 as is compatible with their electrical connection to the etch electrode 38.

The sputter etch electrode 38 is mounted by appropriate means 40 onto an arm 42 rotatably mounted within the chamber 34 by means of a vertical shaft 44. Preferably, the sputtering chamber 34 is provided with as many sputtering means 46 as may be needed or required to carry out the process of the invention. Each sputtering means 46 comprises a sputtering electrode 48, suitably mounted by appropriate insulating means 50, in and to the sputtering chamber 34 and coupled by a cable 52 to a power source (not shown), preferably an rf power source. A sputtering target 54, formed of an appropriate material, is mounted in operative association with the sputtering electrode 48. An inlet 56 is provided in the wall of the sputtering chamber 34 for the purpose of admitting an appropriate inert gas therein, and an outlet 58 is provided to be connected to a vacuum source (not shown) to establish a negative pressure within the chamber 34.

Figure 11:
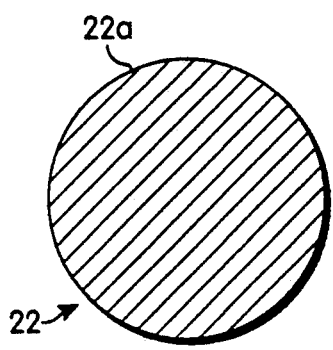
FIGS. 11-16 are views similar to FIG. 8 but on an enlarged scale and illustrating the steps of the inventive process.
Figure 12:
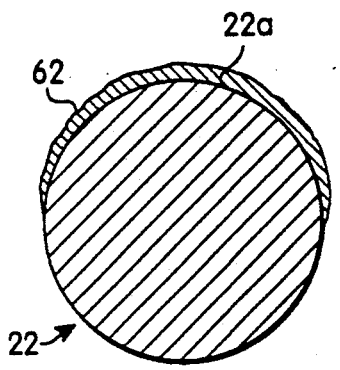
Figure 13:
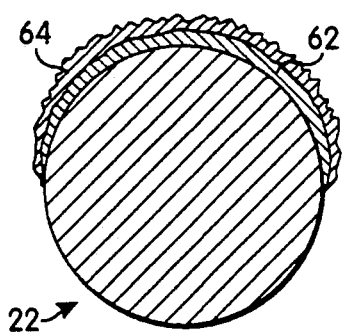
Figure 14:
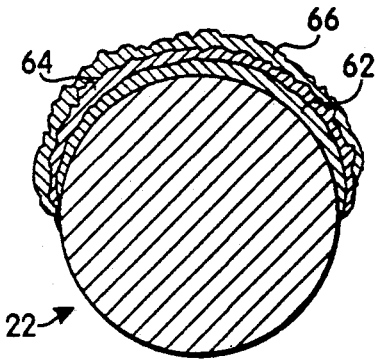
Figure 15:
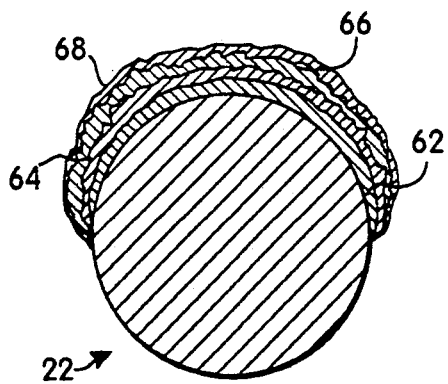
Figure 16:
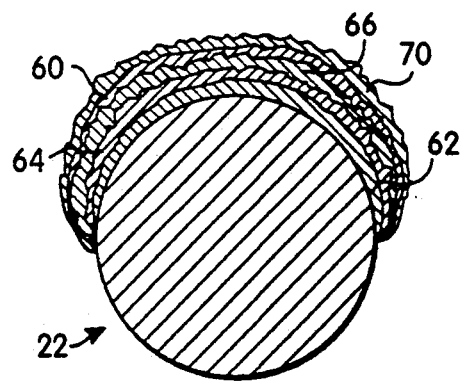

With the cleaned biocompatible electrodes 12 now located within the sputtering chamber 34 and with the aid of the arm 42 located under the appropriate sputtering means 46, the chamber 34 is first evacuated to a negative pressure of at least about $10^{-7}$ torr, removing thereby oxygen and/or water vapor from within the chamber 34, the presence of which could adversely affect the process of the invention. Once the chamber 34 is pumped down, a very pure inert gas, such as ultrapure argon, is introduced into the chamber 34 via the inlet 56, typically at a pressure of several millitorr. Other inert gases, besides argon, including neon, krypton or xenon may be used. Next electrical, preferably radio frequency (rf), power is applied to the biocompatible electrodes 12 via the sputter etch electrode 32 to generate a plasma and the electrode tips 16 are exposed to bombardment by ions of the pure inert gas. Such a bombardment by ions of the inert gas effects removal of the outermost layers of the fine mesh of wires 18 or of the agglomerations 20 of metal particles comprising the tips 16 of the biocompatible electrodes 12, making them atomically clean. Such an atomically clean surface 22a of a single fine wire 22, on an enlarged scale, is illustrated in FIG. 11.

Radiofrequency (rf) power at a level of several hundreds of watts, typcially about 500 Watts for a 6" diameter electrode, is next applied to the sputtering electrode 48. Sputtering electrode 48 carries a sputtering target 54 formed of titanium, and the applied rf power generates a plasma discharge 60 within the chamber 34 directly above the fixture 32 holding the biocompatible electrodes 12. The pressure of the inert gas within the chamber 34 remains the same. The result of the plasma discharge is the deposition and growth of a titanium adhesion layer 62 on the atomically clean surface 22a of the fine wire 22, which of course is a part of the fine wire mesh 18 comprising the tip 16 of the biocompatible electrodes 12, as above mentioned.

Following the deposition of the adhesion layer 62 on each of the wires 22 or metal particles 24 forming the tips 16 of the electrodes 12, the support arm 42 carrying the fixture 32 containing the electrodes 12 is rotated by shaft 44 to a position under another sputtering means 46 carrying a sputtering target 54 formed of aluminum. The rf power now applied to the sputtering electrode 48 is also 500 Watts or higher, in order to raise and/or maintain the temperature of the electrode tips 16 being processed. This will encourage hillock formation, taking advantage of a heretofore undesirable and troublesome feature noticed in the semiconductor electronics industry, see O. W. Holland et al., "Hillocked Reduction in Ion-Implanted Metal," *J. Electrochem. Soc.: Solid-State Science and Technology*, Vol. 134, No. 8, Aug. 1987, pp. 2017-2019. As noted in this article, such hillocks, the suppression of which is highlighted therein, have been a major cause of failure in electronic devices having multiple metallic layers. This is so since the unwanted hillocks in such devices tend to penetrate any overlying dielectric films, forming unintended electrical connections between levels of metallization. One factor in such hillock formation is surface diffusion of the metal atoms as they impinge upon the surface. This surface diffusion effect is enhanced by the heat generated during the process.

With the temperature of the electrode tips 16 raised to a high level, preferably about 400° to 700° F., a hillocked aluminum layer 64, of a preferred thickness of about 2 to 5 um, is deposited and grown on the titanium adhesion layer 62. Both the adhesion layer 62 and the hillocked layer 64 can comprise other materials, provided they are compatible with one another. For example, the adhesion layer 62, can comprise, in addition to titanium, zirconium, chromium or nickel.

If desired, an intermediate adhesion layer 66 is now deposited and grown on the hillocked layer 64 by moving the support arm 42, and thereby the fixture 32 containing the electrodes 12, underneath the appropriate sputtering means 46 provided with the appropriate sputtering target 54. This intermediate adhesion layer 66 preferably is formed of titanium.

If desired, the hillock-forming layer, the first adhesion layer, and the intermediate adhesion layer can all be combined into a single thick titanium layer which is deposited at a high power level to insure a temperature elevation in the electrode tips. While it is aluminum that is well known to be prone to hillock formation in sputtered films, titanium films behave similarly where sputter deposited under conditions described herein.

Next, a biocompatible coating 68 is deposited and grown on the second adhesion layer 66, or in the absence thereof, on the hillocked layer 64, by moving the arm 42 and thus the fixture 32 under the appropriate sputtering means 46 provided with the appropriate sputtering target. Preferably, the biocompatible coating 68 is formed of platinum. Also preferably, during the deposition of the biocompatible coating 68, the pressure of the inert gas within the chamber 34 is increased from about the several millitorrs to about 15 to 20 millitorr. Such added pressure by the inert gas within the chamber 34 enhances the protective coverage of all required surfaces of the electrode tips 16 by increasing the degree of scattering of the platinum atoms and ions on their way from the sputtering target 54 to the tips 16 of the electrodes 12, and thus "throwing power" of the coating process increases.

Finally and if desired, a further second biocompatible coating 70 is deposited and grown on the first biocompatible coating 68. Preferably, this second coating 70 is thinner (about 0.3 um) than the first coating (about 2 um) and also is designed to add black coloring to the tips 16 of the electrodes 12. Accordingly, the arm 42 will now swing under that particular sputtering means 46 provided with elemental carbon as its sputtering target 54. The provision of a thin elemental carbon coating 70 further enhances the biocompatibility of the electrode tips 16 and gives them a matte black finish, an appearance that gives the tips 16 a greater perceived surface area.

Figure 2:
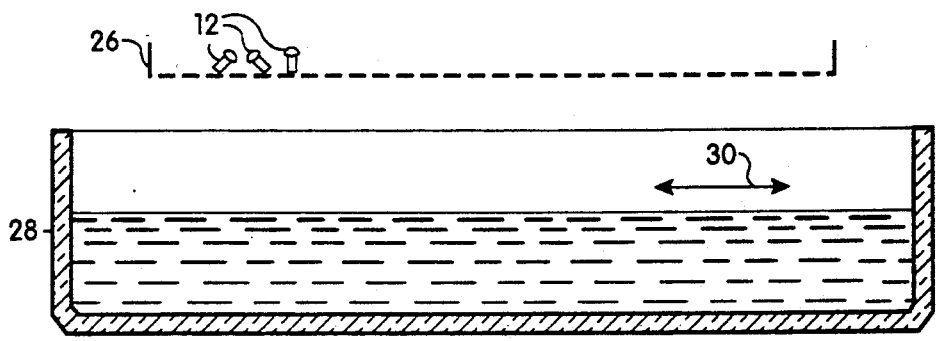
FIG. 2 is a vertical schematic illustrating one preferred step of the process according to the invention.
Figure 3:
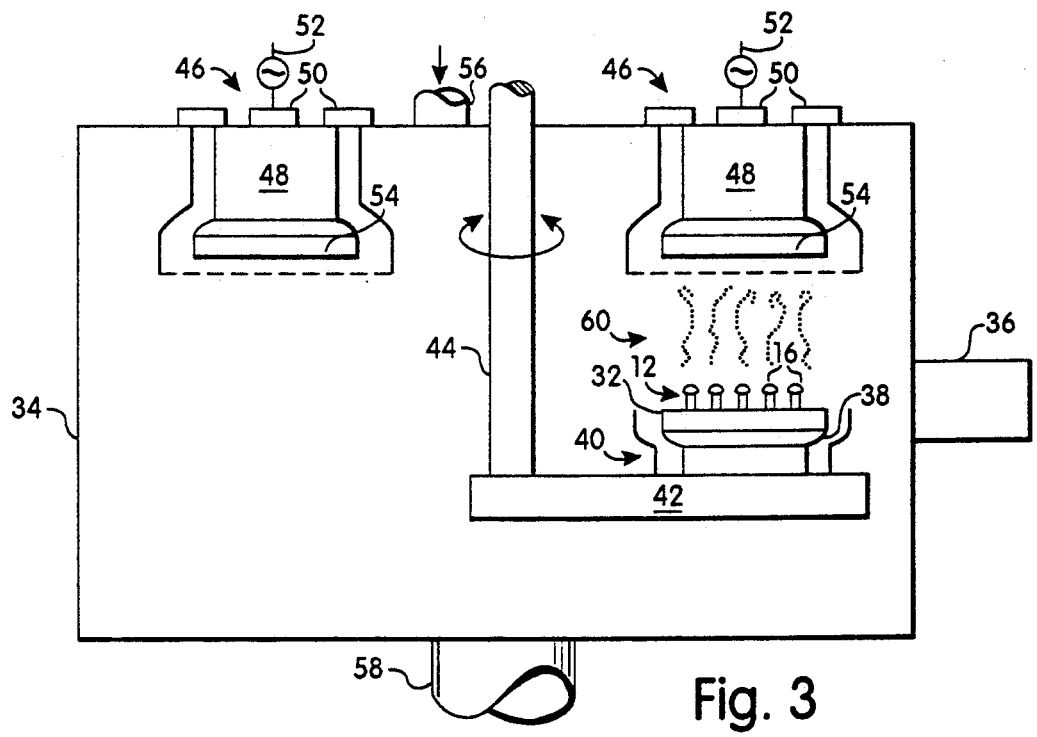
FIG. 3 is a vertical schematic illustrating one preferred apparatus for practicing the process according to the invention.
Figure 10:
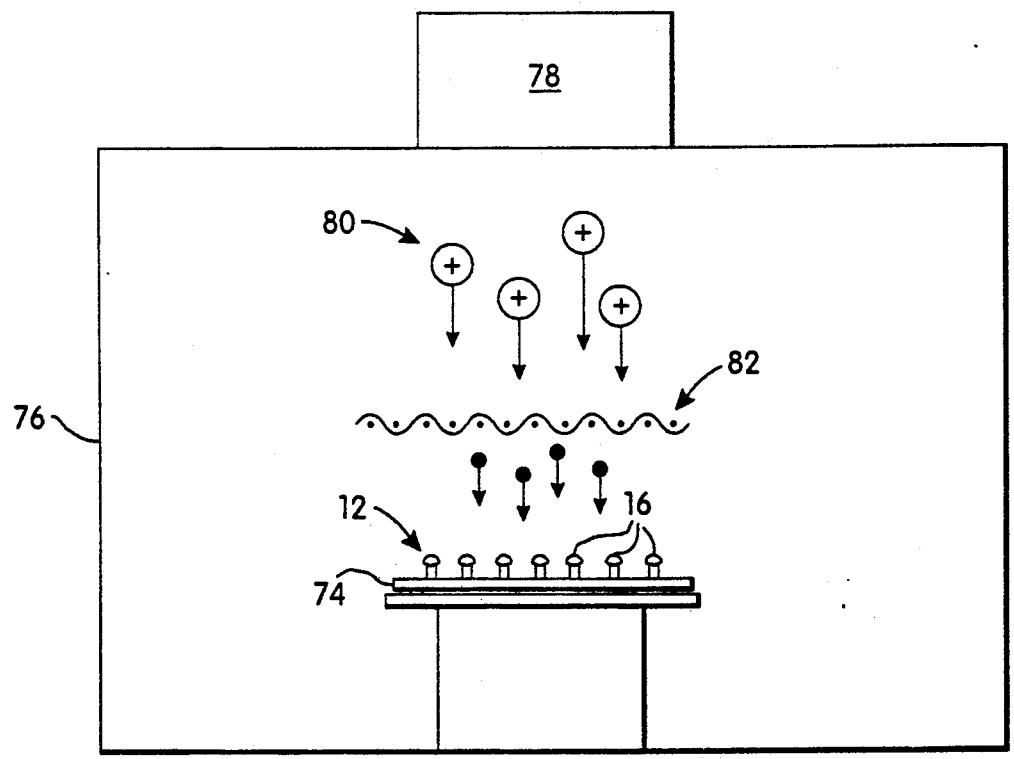
FIG. 10 is a view similar to that shown in FIG. 3 but illustrating a second preferred apparatus for practicing a second preferred process according to the invention.

A second preferred process according to the invention is best described with reference to FIG. 10. After the plurality of biocompatible electrodes 12 have been cleaned of contaminants as described above with reference to FIGS. 1 and 2, they are transferred to a fixture 74 and introduced thereby into a sputtering chamber 76. Sputtering chamber 76 preferably is provided with a Kaufman (or other similar type of) ion source 78, arranged to generate a beam 80 of ions of a chemically inert substance, such as argon, neon, krypton or xenon, and to bombard therewith the electrode tips 16. Simultaneously with the bombardment of the tips 16 with the beam of ions 80, the tips 16 also are exposed to deposition of a seeding material from a suitable wire mesh 82 interposed between the ion source 78 and the electrode tips 16. In this process, both the surfaces of the electrode tips 16 as well as the seeding material must be formed of biocompatible materials.

Accordingly and preferably, the electrode tips 16 are typically formed of platinum or platinum-rhodium. The seeding material forming the wire mesh 82 on the other hand, is formed of tantalum or titanium. Further, this process is most advantageous in forming the desired textured surfaces on the electrode tips 16, whenever the sputtering yield of the seeding material is lower than that of the material comprising the electrode tips 16, further enhancing the texturing in the form of microscopic whiskers or cones.

Further, in addition to the inert gas introduced into the sputtering chamber 76, that is after the chamber's evacuation to a negative pressure of at least about $10^{-7}$ torr, also preferably oxygen is included into the beam of ions 80 whenever it is desired that the deposited seeding material on the electrode tips 16 be tantalum oxide or titanium oxide, representing a more effective seeding material. Preferably, the oxygen is present in the beam of ions 80 at a partial pressure of from about 2 to about 5 percent.

EXAMPLE I

Biocompatible electrodes 12 formed of platinum, and having tips 16 formed of fine wire mesh, with a diameter size of about 50 um, and comprising platinum, were treated according to the process of the invention, with the following processing parameters:

Electrodes 12 cleaned in successive baths of trichlorothane, acetone, and 2-propanol for ½ hour, followed by draining dry without evaporation.

Inert gas in sputtering chamber: Argon

Sputtering Targets employed, seriatim: titanium, aluminum, platinum and carbon.

Time duration exposure of the electrode tips to sputter-etch cleaning: 4 minutes.

Thickness of adhesion layer 62: about 0.2 um.

Thickness of hillocked layer 64: about 6.0 um.

Thickness of second adhesion layer 66: about 0.2 um.

Thickness of biocompatible (platinum) layer 68: about 0.2 um.

Thickness of carbon layer: about 0.6 um.

EXAMPLE II

Biocompatible electrodes 12 formed of platinum, and having tips 16 formed of fine wire mesh, with a diameter size of about 50 um, and comprising platinum, were treated according to the process of the invention, with the following processing parameters:

Electrodes 12 cleaned in successive baths of trichlorothane, acetone, and 2-propanol for ½ hour, followed by draining dry without evaporation.

Inert gas in sputtering chamber: Argon

Sputtering Targets employed, seriatim: titanium, platinum and carbon.

Time duration exposure of the electrode tips to sputter-etch cleaning: 4 minutes.

Thickness of combined adhesion and hillocked layers of titanium: about 9 um.

Thickness of biocompatible (platinum) layer: about 0.2 um.

Thickness of carbon layer: about 0.6 um.

EXAMPLE III

Biocompatible electrodes 12 formed of platinum, and having tips 16 formed of fine wire mesh, with a diameter size of about 50 um, and comprising platinum, were treated according to the process of the invention, with the following processing parameters:

Electrodes 12 cleaned in successive baths of trichlorothane, acetone, and 2-propanol for ½ hour, followed by draining dry without evaporation.

Inert gas in Kaufman Source: Argon.

Seeding Target (mesh) employed: Tantalum.

Ion beam current density form the Kaufman source: about 0.2 ma/cm².

Accelerating potential of the ion beam: 1,000 volts.

Time duration exposure to ion of the inert gas: about 20 hours.

Mean height of texturing (whiskers, cones): about 10 um.

Thus it has been shown and described a process and a product for the improvement of the sensing function of biocompatible electrodes which process and product satisfy the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. A process of making biocompatible electrode tips characterized by enhanced electrical properties comprising:
   (a) cleaning a plurality of electrode tips of contaminants;
   (b) introducing said tips cleaned of contaminants into a sputtering chamber;
   (c) evacuating said chamber to a vacuum of at least about $10^{-7}$ torr;
   (d) introducing an inert gas into said chamber and generating a plasma discharge therein;
   (e) exposing said cleaned tips to bombardment by ions of said inert gas;
   (f) depositing an adhesion layer on said tips;
   (g) depositing a hillocked layer on said adhesion layer; and
   (h) depositing a biocompatible coating on said hillocked layer;
   (i) during said exposing said cleaned tips to said bombardment by ions of said inert gas, power to generate said plasma discharge at a first level is first applied to said electrode tips;
   (j) power is next applied to a sputtering electrode carrying a target comprised of a material designed to form said adhesion layer;
   (k) said depositing said hillocked layer on said adhesion layer is effected at a second power level in said plasma discharge so as to raise the temperature of said electrode tips, facilitating thereby the deposition of said hillocked layer.

2. The process of claim 1 wherein said inert gas is one of a group consisting of argon, neon, krypton, and xenon; wherein said adhesion layer is formed of a group of materials consisting of titanium, zirconium, chromium, and nickel; and wherein said biocompatible coating is formed of a group of materials consisting of platinum, platinum-rhodium, and carbon.

3. The process of claim 1 further including a step of depositing a second adhesion layer on said hillocked layer before depositing said biocompatible coating thereon; and further including a step of depositing a second biocompatible coating on top of said biocompatible coating.

4. The process of claim 3 wherein said hillocked layer is formed of a group of materials consisting of aluminum, titanium, and zirconium, and wherein said second coating is formed of a group of materials consisting of elemental carbon.

5. The process of claim 1 wherein said electrode tips comprise assemblies of fine metal wires.

6. The process of claim 1 wherein said electrode tips comprise agglomerations of fine metal particles.

7. A process of making biocompatible electrode tips characterized by enhanced electrical properties comprising:
   (a) cleaning a plurality of electrode tips of contaminants;
   (b) introducing said tips cleaned of contaminants into a sputtering chamber;
   (c) evacuating said chamber to a vacuum of at least about $10^{-7}$ torr;
   (d) introducing an inert gas into said chamber and generating a plasma discharge therein;
   (e) exposing said cleaned tips to bombardment by ions of said inert gas;

(f) depositing an adhesion layer on said tips;
(g) depositing a hillocked layer on said adhesion layer; and
(h) depositing a biocompatible coating on said hillocked layer;
(i) said cleaning of said plurality of electrode tips being effected by solvent rinsing, with ultrasonic agitation, in a beaker, followed by allowing said rinsed tips to drain dry.

8. A process of making biocompatible electrode tips characterized by enhanced electrical properties comprising:
   (a) cleaning a plurality of electrode tips of contaminants;
   (b) introducing said tips cleaned of contaminants into a sputtering chamber;
   (c) evacuating said chamber to a vacuum of at least about $10^{-7}$ torr;
   (d) introducing an inert gas and oxygen into said chamber, and positioning a seed target therein;
   (e) exposing said cleaned tips and seed target to bombardment by ions of said inert gas, and to partial pressure of said oxygen;
   (f) depositing an adhesion layer on said tips;
   (g) depositing a hillocked layer on said adhesion layer; and
   (h) depositing a biocompatible coating on said hillocked layer;
   (i) said seed target being in the form of a mesh of wires or filaments interposed between an ion source and the electrode tips;
   (j) said oxygen being present therein at a partial pressure of about 2 to 5 percent.

9. The process of claim 8 wherein said inert gas is one of a group consisting of argon, neon, krypton, and xenon; and wherein said seed target is one of a group consisting of tantalum, titanium, and carbon.

* * * * *